(12) United States Patent
Lee et al.

(10) Patent No.: US 12,119,342 B2
(45) Date of Patent: Oct. 15, 2024

(54) RESISTOR AND RESISTOR-TRANSISTOR-LOGIC CIRCUIT WITH GaN STRUCTURE AND METHOD OF MANUFACTURING THE SAME

(71) Applicant: UNITED MICROELECTRONICS CORP., Hsin-Chu (TW)

(72) Inventors: Kuo-Hsing Lee, Hsinchu County (TW); Sheng-Yuan Hsueh, Tainan (TW); Chien-Liang Wu, Tainan (TW); Te-Wei Yeh, Kaohsiung (TW); Yi-Chun Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/119,253

(22) Filed: Mar. 8, 2023

(65) Prior Publication Data

US 2023/0223399 A1    Jul. 13, 2023

Related U.S. Application Data

(62) Division of application No. 17/075,707, filed on Oct. 21, 2020, now Pat. No. 11,631,664.

(30) Foreign Application Priority Data

Sep. 21, 2020    (CN) .......................... 202010993249.2

(51) Int. Cl.
*H01L 27/06*    (2006.01)
*H01L 21/306*    (2006.01)
(Continued)

(52) U.S. Cl.
CPC .... *H01L 27/0605* (2013.01); *H01L 21/30621* (2013.01); *H01L 21/765* (2013.01);
(Continued)

(58) Field of Classification Search
CPC ............ H01L 27/0605; H01L 27/0629; H01L 27/0635; H01L 27/0647–067;
(Continued)

(56) References Cited

U.S. PATENT DOCUMENTS 9,660,064 B2    5/2017  Dasgupta
9,761,675 B1    9/2017  Marinella
(Continued)

FOREIGN PATENT DOCUMENTS

WO    WO-2018063397 A1 *  4/2018  ............. H01L 27/24

OTHER PUBLICATIONS

X. Li et al., GaN-on-SOI: Monolithically Integrated ALL-GaN ICs for Power Conversion, International Electron Devices Meeting (IEDM), 2019 IEEE, pp. 78-81, USA, XP033714485 ,2019.
(Continued)

*Primary Examiner* — Natalia A Gondarenko
(74) *Attorney, Agent, or Firm* — Winston Hsu (57) ABSTRACT

A resistor with GaN structures, including a GaN layer with a 2DEG resistor region and an undoped polysilicon resistor region, an AlGaN barrier layer on the GaN layer in the 2DEG resistor region, multiple p-type doped GaN capping layers arranged on the AlGaN barrier layer so that the GaN layer not covered by the p-type doped GaN capping layers in the 2DEG resistor region is converted into a 2DEG resistor, a passivation layer on the GaN layer, and an undoped polysilicon layer on the passivation layer in the undoped polysilicon resistor region and functions as an undoped polysilicon resistor.

6 Claims, 10 Drawing Sheets

(51) Int. Cl.
*H01L 21/765* (2006.01)
*H01L 21/8252* (2006.01)
*H01L 29/20* (2006.01)
*H01L 29/205* (2006.01)
*H01L 29/40* (2006.01)
*H01L 29/66* (2006.01)
*H01L 29/778* (2006.01)
*H01L 49/02* (2006.01)

(52) U.S. Cl.
CPC ...... *H01L 21/8252* (2013.01); *H01L 27/0629* (2013.01); *H01L 28/20* (2013.01); *H01L 29/2003* (2013.01); *H01L 29/205* (2013.01); *H01L 29/402* (2013.01); *H01L 29/66462* (2013.01); *H01L 29/7786* (2013.01)

(58) Field of Classification Search
CPC .... H01L 27/0711–0722; H01L 27/0705–0738; H01L 27/075–0783; H01L 27/0802; H01L 27/101; H01L 27/1112; H01L 21/30621; H01L 21/765; H01L 21/8252; H01L 28/20–26; H01L 29/2003; H01L 29/205; H01L 29/402; H01L 29/41725–41791; H01L 29/66462; H01L 29/66431; H01L 29/66166; H01L 29/7789; H01L 29/7786; H01L 29/76877; H01L 29/76897; H01L 29/0657; H01L 29/0692; H01L 29/1066; H01L 29/8605; H01L 29/7831; H01L 29/778; H01L 2924/13064; H01L 29/7812; H01L 29/66666; H01L 29/66674; H01L 29/7827; H01L 29/78642; H01L 29/0684; H01L 29/0847; H01L 29/42356; H01L 29/66484; H01L 29/783

USPC ... 257/76, 190, 192, 194, 256, 284, E29.093
See application file for complete search history.

(56) References Cited

U.S. PATENT DOCUMENTS

| | | |
|---|---|---|
| 10,720,913 B1 | 7/2020 | Leong |
| 2006/0088973 A1 | 4/2006 | Chun |
| 2007/0176295 A1 | 8/2007 | Chinthakindi |
| 2011/0057196 A1 | 3/2011 | Chang |
| 2015/0061076 A1* | 3/2015 | Cheng ................. H01L 27/0802 438/382 |
| 2015/0179566 A1 | 6/2015 | Hill |
| 2016/0373106 A1 | 12/2016 | Shah |
| 2017/0018617 A1 | 1/2017 | Xia |
| 2017/0025405 A1 | 1/2017 | Jeon |
| 2017/0133498 A1* | 5/2017 | Okawa ................ H01L 29/0891 |
| 2020/0028437 A1 | 1/2020 | Sharma |
| 2020/0127664 A1 | 4/2020 | Whitney |
| 2020/0168599 A1 | 5/2020 | Udrea |
| 2020/0227407 A1* | 7/2020 | Radosavljevic .... H01L 21/8252 |
| 2021/0043793 A1 | 2/2021 | Roizin |
| 2022/0068910 A1 | 3/2022 | Then |

OTHER PUBLICATIONS

S. You et al., Monolithically integrated GaN power ICs designed using the MIT virtual source GaNFET (MVSG)compact model for enhancement-mode p-GaN gate power HEMTs, logic transistors and resistors, ESSDERC 2019—49th European Solid-State Device Research Conference (ESSDERC), 2019 IEEE, Poland, pp. 158-161, XP033660769 ,2019.

Ruize Sun et al., GaN Power Integration for High Frequency and High Efficiency Power Applications: A Review, Special Section on Emerging Technologies for Energy Internet, IEEE Access, vol. 8, 2020, pp. 15529-15542, China, XP011768508 ,2020.

* cited by examiner

RESISTOR AND RESISTOR-TRANSISTOR-LOGIC CIRCUIT WITH GaN STRUCTURE AND METHOD OF MANUFACTURING THE SAME

CROSS REFERENCE TO RELATED APPLICATIONS

This application is a division of U.S. application Ser. No. 17/075,707, filed on Oct. 21, 2020. The content of the application is incorporated herein by reference.

BACKGROUND OF THE INVENTION

1. Field of the Invention

The present invention relates generally to a resistor and a resistor-transistor-logic (RTL) circuit, and more specifically, to a resistor and a resistor-transistor-logic circuit with gallium nitride (GaN) structure and method of manufacturing the same.

2. Description of the Prior Art

Current semiconductor devices used all over the world are generally Si-based semiconductor using silicon as base material and channels. However, in the application of high-voltage and high power devices, since Si-based device has larger ON resistance that may cause high power consumption and has relatively low switch frequency in high-frequency operation, the performance of Si-based devices is far lower than the level of wide band gap compound semiconductor like gallium nitride (GaN) or silicon carbide (SiC). The wide band gap compound semiconductor material like GaN has wider band gap and lower On resistance, so that it may endure high temperature, high voltage, high frequency and high current and with better energy conversion efficiency. Therefore, GaN material has excellent characteristics of good heat dissipation, small volume, low power consumption and high power, which is suitable in the application of power semiconductor. Boosting by the demand of high-end industry like 5G and electric vehicle in recent years, GaN material becomes a rising star for third generation semiconductor material.

Although GaN-based compound semiconductor materials have promising development prospects, current global application of GaN material is still limited in the aspect like photoelectric, communication and radio frequency, and source power devices. It can't replace conventional Si-base material in the application of logic circuit and design. Therefore, it is still a subject for those skilled in the art to develop and research how to increase the density of GaN-based MOS devices on a wafer so that they can be practically applied in transistorized digital logic circuit design.

SUMMARY OF THE INVENTION

In light of increased demand and development for aforementioned GaN wide band gap compound semiconductor material, the present invention hereby provides a resistor-transistor-logic (RTL) circuit structure adopting GaN-based structure. The essential feature of the present invention is that its two-dimensional electron gas (2DEG) resistor device is not formed by conventional mesa etching method. Instead, its resistor is formed by forming p-type doped GaN patterns on a GaN layer to define depletion regions. The advantage of this approach is, in comparison to the mesa etching, that it may significantly increase the density of the resistor devices so that the density of whole RTL circuit may be improved.

One aspect of the present invention is to provide a resistor-transistor-logic circuit with GaN structure, including a GaN layer with a high-voltage device region, a low-voltage device region and a resistor region, an AlGaN barrier layer on the GaN layer, multiple p-type doped GaN capping layers on the AlGaN barrier layer, wherein parts of the p-type doped GaN capping layers in the high-voltage device region and the low-voltage device region convert the GaN layer under the part of p-type doped GaN capping layers into gate depletion regions, the GaN layer not covered by the p-type doped GaN capping layers in the resistor region functions as a 2DEG resistor. Multiple first gates are formed on the p-type doped GaN capping layers in the high-voltage device region, multiple first sources and multiple first drains are formed on the GaN layer in the high-voltage device region, wherein the first gates, the first sources and the first drains constitute high-voltage HEMTs. Multiple second gates are formed on the p-type doped GaN capping layers in the low-voltage device region, and multiple second sources and multiple second drains are formed on the GaN layer in the low-voltage device region, wherein the second gates, the second sources and the second drains constitute low-voltage logic FETs.

Another aspect of the present invention is to provide a resistor with GaN structure, including a GaN layer with a 2DEG resistor region and an undoped polysilicon resistor region, an AlGaN barrier layer on the GaN layer in the 2DEG resistor region, multiple p-type doped GaN capping layers arranged on the AlGaN barrier layer so that the GaN layer not covered by the p-type doped GaN capping layers in the 2DEG resistor region become a 2DEG resistor, a passivation layer on the GaN layer, and an undoped polysilicon layer on the passivation layer in the undoped polysilicon resistor region and functions as an undoped polysilicon resistor.

Still another aspect of the present invention is to a method of manufacturing a resistor-transistor-logic circuit with GaN structure, including steps of providing a substrate with a high-voltage device region, a low-voltage device region and a resistor region, sequentially forming a GaN layer, an AlGaN barrier layer and a p-type doped GaN capping layer on the substrate, patterning the p-type doped GaN capping layer into multiple p-type doped GaN capping patterns, wherein the GaN layer under part of the p-type doped GaN capping patterns becomes gate depletion regions, and the GaN layer not covered by the p-type doped GaN capping patterns in the resistor region functions as 2DEG resistors, forming a passivation layer on the GaN layer and the p-type doped GaN capping patterns, forming multiple sources and drains on the GaN layer in the passivation layer, and forming multiple gates on the p-type doped GaN capping patterns in the passivation layer, wherein the gates, the sources and the drains in the high-voltage device region constitute high-voltage HEMTs, and the gates, the sources and the drains in the low-voltage device region constitute low-voltage logic FETs.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

Figure 6:
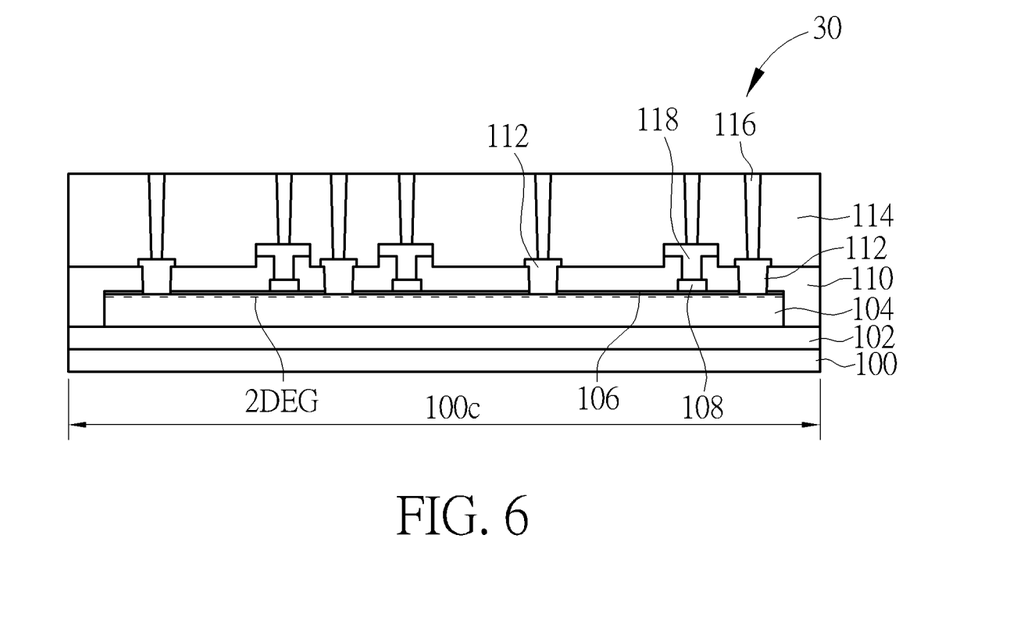
FIG. 6 is a cross-section along the section line C-C' in FIG. 5.
Figure 7:
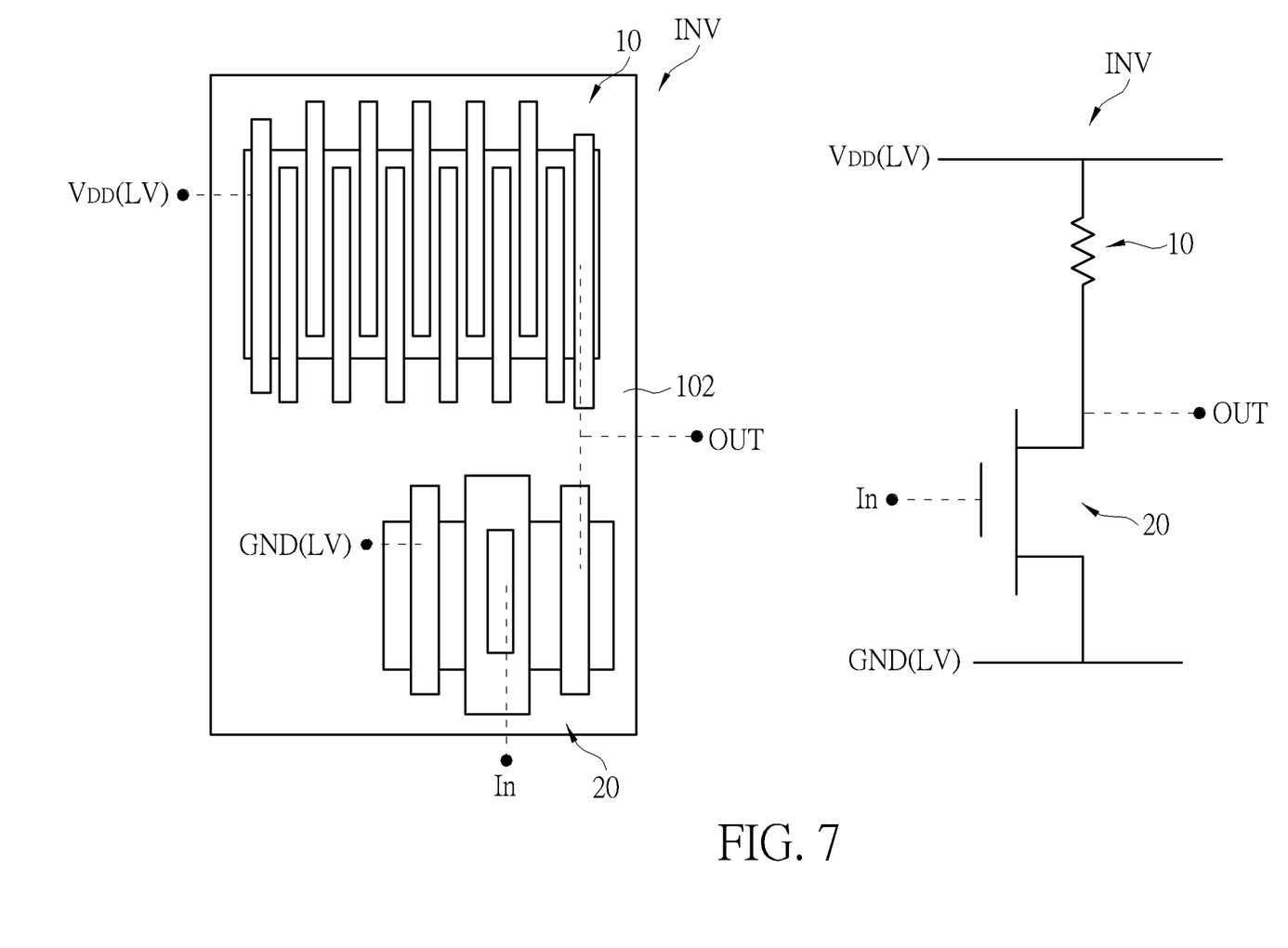
FIG. 7 is a schematic plan view and a circuit diagram of a resistor-transistor-logic inverter (INV) circuit structure in accordance with the preferred embodiment of present invention.

The purpose of present invention is to provide a circuit structure used gallium nitride (GaN) as channels. The resistor devices (FIG. 1 and FIG. 2), low-voltage logic field effect transistors (FETs, in FIG. 3 and FIG. 4) and high-voltage high electron mobility transistor (HEMTs, in FIG. 5 and FIG. 6) with this kind of GaN channels will be described in embodiments, and the resistor-transistor-logic (RTL) circuit design based on these devices are also provided (FIG. 7 and FIG. 9). Furthermore, the GaN-based resistor provided in the present invention may work together with other known resistors to provide a full-scale resistor combination with different resistance magnitudes to be applied in different circuit structures or components.

According to the embodiment of present invention, forming an aluminum gallium nitride (AlGaN) barrier layer on a GaN layer can constitute a heteroepitaxial structure. The spontaneous polarization induced by the strain at the heterogeneous interface and the piezoelectric polarization induced by the epitaxial stress would form a two-dimensional electron gas (2DEG) channel in the GaN layer close to the interface. The 2DEG channel has the characteristics of extremely high charge polarization, high mobility as well as excellent thermal stability and high breakdown field, so this structure may be used to constitute HEMT devices. However, the FET constituted by the aforementioned channel mechanism is normally-on (i.e., its conductive channel is always on without voltage applied to gates). A gate bias will be needed to cut off this type of normally-on transistor, so that it may have increased power consumption and require additional layout area for control circuits. In the light of this, by forming a p-type doped GaN (p-GaN) capping layer on the AlGaN layer, the 2DEG channel under the GaN layer may be depleted into a gate depletion region, so as to manufacture normally-off or enhancement mode FET devices, which is always in off state without applied bias to gate.

According to the aforementioned fundamental principle about the GaN epitaxial structure, relevant GaN devices in the present invention will now be described in following embodiments. Firstly, please refer to FIG. 1, which is a schematic plan view of a 2DEG resistor in accordance with the preferred embodiment of the present invention. The 2DEG resistor 10 in the present invention is formed on a GaN epitaxial layer 102. A GaN mesa layer 104 and an AlGaN barrier layer 106 on the GaN mesa layer 104 are formed on the GaN epitaxial layer 102 to define the boundary of active areas of the GaN devices. In order to convert the GaN mesa layer 104 into desired resistor structures, multiple p-type doped GaN capping layer 108 are formed on the AlGaN barrier layer 106 in a staggered arrangement, so that the exposed region of the GaN mesa layer/AlGaN barrier layer 104/106 looks like a winding pattern in the plan view. Part of the p-type doped GaN capping layer 108 may extend beyond the GaN mesa layer 104. The winding portion of the exposed GaN mesa layer/AlGaN barrier layer 104/106 has higher conductivity than the one of surrounding portion that is covered by the p-type doped GaN capping layer 108, so the winding portion may function as a customized resistor structure. The length and width of the winding portion and the thickness of 2DEG channel formed therein determine the resistance of the resistor, which is about 300 ohm/sq, suitable as a resistor component for digital logic circuit. Source and drain 112 are formed at two terminals of the winding pattern and are further connected to external circuit through upper contacts 116.

Figure 1:
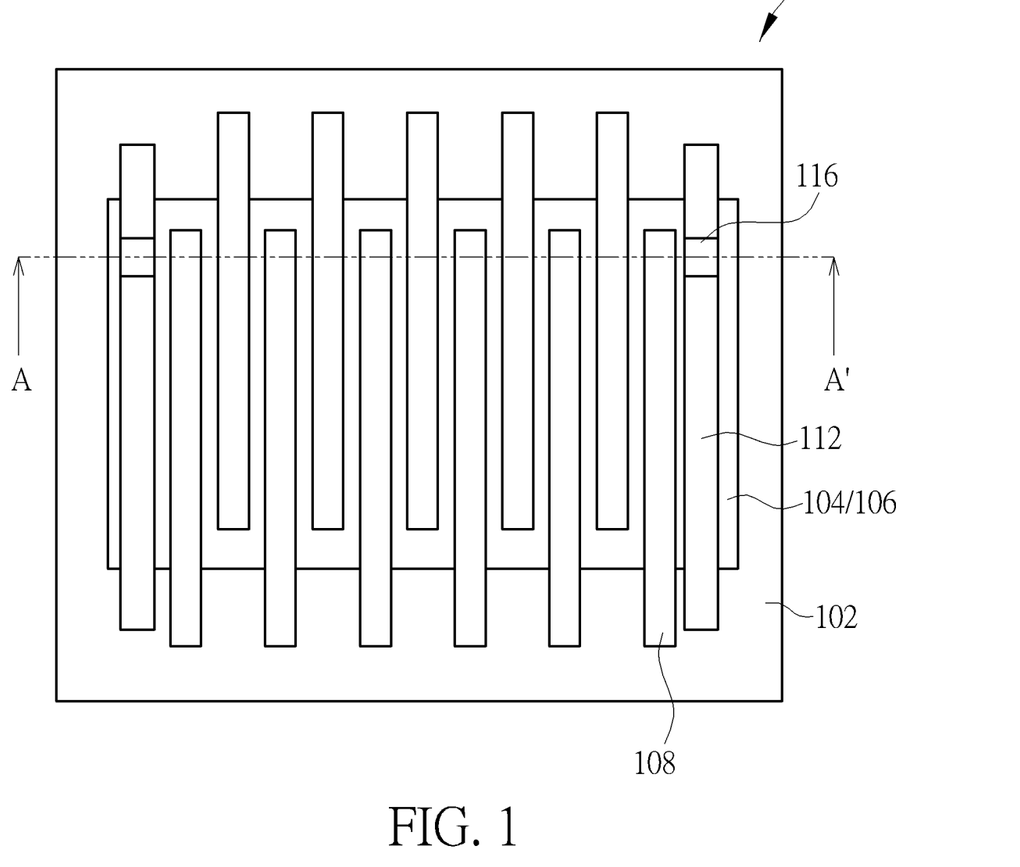
FIG. 1 is a schematic plan view of a 2DEG resistor in accordance with the preferred embodiment of present invention.
Figure 2:
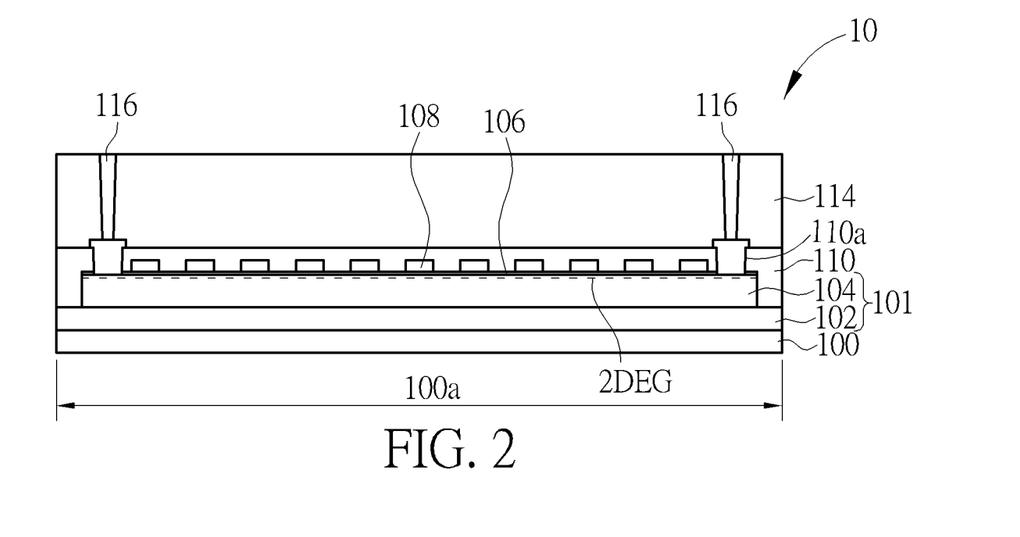
FIG. 2 is a cross-section along the section line A-A' in FIG. 1.

Next, please refer to FIG. 2, which is a cross-section along the section line A-A' in FIG. 1. The following embodiment will describe the vertical connections and relative positions of the components of the 2DEG resistor 10 and their manufacturing method in cross-sectional views. A substrate 100 is provided at the bottom of the 2DEG resistor 10. The substrate 100 is divided into three different device regions, including a resistor region 100a, a low-voltage device region 100b (FIG. 4) and a high-voltage device region 100c (FIG. 6). The 2DEG resistor 10 of the present invention is formed in the divided resistor region 100a. A silicon substrate with <111> crystallographic plane may be used as the substrate 100 to avoid dislocation or defect issues caused by mismatched lattice constants and coefficients of thermal expansion in later heterogeneous epitaxy process. In other embodiment, aluminum oxide, silicon carbide <0001>, gallium arsenide <100> or gallium arsenide <111> may also be used as the material of the substrate 100. Next, forming a GaN epitaxial layer 101 and an AlGaN barrier layer 106 sequentially, for example by MOCVD or HVPE process, on the substrate 100. A 2DEG channel is formed in the GaN epitaxial layer 101 close to the heterogeneous interface between the GaN epitaxial layer 101 and the AlGaN barrier layer 106. In some embodiment, AlGaN barrier layer 106 may be a multilayer structure, which may include layers of AlN, AlGaN and/or InAlGaN, etc., and these layers may have gradient composition ratios to achieve better epitaxy quality and channel characteristics. In some embodiment, buffer layers or superlattice layers (not shown) made of low-temperature GaN, AlN or ZnO may be grown in advance on the substrate 100 before the high-temperature GaN epitaxial layer 101 and the AlGaN barrier layer 106, in order to mitigate the lattice mismatch issue.

Refer still to FIG. 2. After the GaN epitaxial layer 102 and the AlGaN barrier layer 106 are formed, a mesa etching process is then required to form the active areas of devices and achieve better performances of breakdown voltage and drain leakage. A dry etching process like ICP or RIE with $Cl_2/Ar$ or $Cl_2/BCl_3$ based etching gas may be adopted to pattern the GaN epitaxial layer 102 and the AlGaN barrier layer 106 thereon to a certain depth, so as to form a damage-free mesa isolation with vertical sidewalls. It is shown in the figure that the GaN epitaxial layer 101 grown in previous process is divided into a lower GaN epitaxial layer 102 covering the whole substrate 100 and an upper GaN mesa layer 104 in the defined the active area. The AlGaN barrier layer 106 remains only on the GaN mesa layer 104 to form the 2DEG channel required only in the area. In other embodiments, the device may be manufactured directly on the GaN epitaxial layer 101 without mesa etching to form the GaN mesa layer 104.

Refer still to FIG. 2. After the GaN mesa layer 104 is formed, a patterned p-type doped GaN capping layer 108 is then formed on the AlGaN barrier layer 106. The p-type doped GaN capping layer 108 may be a GaN layer doped with Mg. The p-type doped GaN capping layer 108 is patterned into multiple strip patterns as shown in FIG. 1. In this way, the 2DEG channel in the GaN mesa layer 104 right under the patterned p-type doped GaN capping layer 108 is converted into a normally-off depletion region, while the GaN mesa layer 104 not covered by the patterned p-type doped GaN capping layer 108, i.e. the winding pattern in FIG. 1, may functions as a resistor structure with higher conductivity. The p-type doped GaN capping layer 108 may be formed and patterned by the same processes as the ones used in aforementioned mesa etching step. After the patterned p-type doped GaN capping layer 108 is formed, a passivation layer 110, such as a SiN layer, is then formed on the substrate 100 to cover the GaN epitaxial layer 102, GaN mesa layer 104, AlGaN barrier layer 106 and patterned p-type doped GaN capping layer 108. In the embodiment of present invention, the passivation layer 110 not only protects the patterned p-type doped GaN capping layer 108 and the AlGaN barrier layer 106, but also provides isolation effect to reduce current leakage for the gates and source/drains of HEMT devices that will be formed in later processes. In some embodiment, the passivation layer 110 may further function as a dielectric layer for field plate portions or structures. The passivation layer 110 in the embodiments may be formed by CVD process, with materials selected from silicon oxide, aluminum oxide, aluminum nitride, silicon oxynitride, Teflon® or hafnium oxide.

Refer still to FIG. 2. After the passivation layer 110 is formed, source/drain openings 110a are then formed in the passivation layer 110, and the openings 110a are then filled with source/drain material to form sources/drains 112. The steps of forming sources/drains 112 may include: firstly, forming openings in the passivation layer 110, performing an E-beam evaporation to deposit source/drain material, ex. multilayer structure made of Ti/Al/Ni/Ag materials, in the source/drain openings 110a and on the passivation layer 110. A photolithography process is then performed to pattern the source/drain material on the passivation layer 110 to form source/drain patterns. Lastly, perform a rapid thermal annealing process to form ohmic contacts. In the embodiment of the present invention, the AlGaN barrier layer 106 under sources/drains 112 may be optionally removed or kept. It is shown in the figure that the sources/drains 112 formed after the process are provided with horizontally extending field plate portions 112a on the passivation layer 110, which may modify the electric field there to achieve better breakdown voltage.

Refer still to FIG. 2. After the sources/drains 112 are formed, an interlayer dielectric 114 is formed on entire passivation layer 110 to cover the sources/drains 112. The interlayer dielectric 114 may be formed by CVD with materials like silicon oxide. Next, forming contact openings in the interlayer dielectric 114 to expose the sources/drains 112 and filling the contact openings with contact material such as W, Co or Cu, to form contacts 116 connecting the sources/drains 112. The manufacture of 2DEG resistor 10 of the present invention is, therefore, completed.

The advantages of the 2DEG resistor 10 in present invention is, by adopting the method of forming depletion regions with p-type doped GaN capping layer 108 to define the winding structure of resistor, the approach of present invention make it easier to reduce the width of the winding structure in comparison to conventional mesa etching approach for forming the winding structure in prior art, so that the density per unit area of the resistor of the present invention may be significantly increased to benefit the application of the devices in the manufacture and design of RTL circuit.

Figure 3:
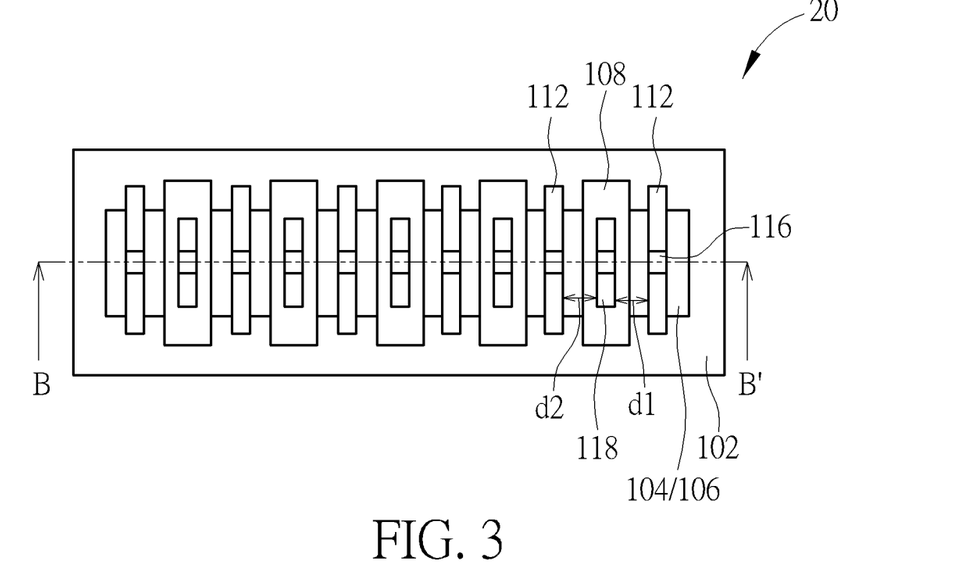
FIG. 3 is a schematic plan view of low-voltage logic FETs in accordance with the preferred embodiment of present invention.

Please refer next to FIG. 3, which is a schematic plan view of low-voltage logic FETs 20 in accordance with the preferred embodiment of present invention. In addition to the aforementioned resistor devices, in the embodiment of present invention, the GaN-base structure may also form desired FET structures on the substrate in similar way. As shown in the figure, similarly, the low-voltage logic FETs 20 is also formed on the same GaN epitaxial layer 102 as the aforementioned 2DEG resistor 10. The GaN epitaxial layer 102 is provided with the GaN mesa layer 104 and the AlGaN barrier layer 106 on the GaN mesa layer 104, to define the active areas of the low-voltage logic FETs 20 and form 2DEG channels. Unlike the aforementioned 2DEG resistor 10, multiple spaced apart p-type doped GaN capping layer 108 are provided on the AlGaN barrier layer 106 to form normally-off gate depletion regions in the GaN mesa layer 104, wherein each p-type doped GaN capping layer 108 corresponds to a gate region with a gate 118 formed thereon. Parts of the p-type doped GaN capping layer 108 may extend beyond the GaN mesa layer 104. In this way, the exposed GaN mesa layer/AlGaN barrier layer 104/106 would have higher conductivity than the one of surrounding gate regions covered by the p-type doped GaN capping layer 108, so that it may function as source/drain regions for the low-voltage FETs 20, and sources/drains 112 are formed on these regions. Contacts 116 are formed on gates 118 and sources/drains 112 to electrically connect to external circuits.

Please note that, in the embodiment of present invention, the spacing d1 between source and gate of the low-voltage logic FET 20 is intended to be equal to the spacing d2 between drain and gate of the low-voltage logic FET 20. This feature is distinguished from the one in prior art, that the spacing between drain and gate of the GaN HEMT device is usually designedly larger than the spacing between source and gate. The advantage of equal spacing is that it may significantly reduce necessary layout area for the devices, thereby significantly increasing the density per unit area of the FETs and benefiting the application in the manufacture and design of RTL circuits.

Figure 4:
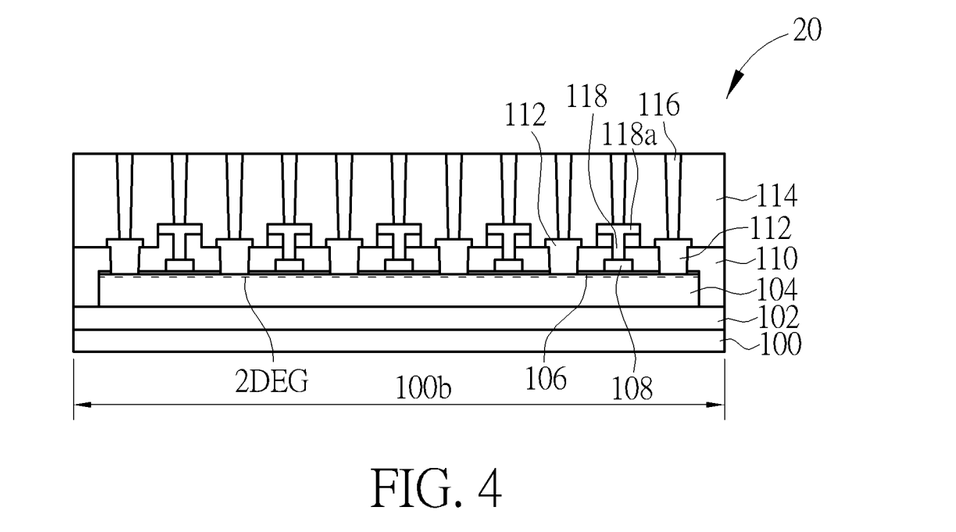
FIG. 4 is a cross-section along the section line B-B' in FIG. 3.

Next, please refer to FIG. 4, which is a cross-section along the section line B-B' in FIG. 3. The following embodiment will describe the vertical connections and relative positions of the components of the low-voltage logic FET 20 and their manufacturing method in cross-sectional views. The layer structures and processes of the low-voltage logic FET 20 are generally the same as the ones of aforementioned 2DEG resistor 10, with the difference that the low-voltage FET 20 is formed in the low-voltage device region 100b of the substrate 100, and the main purpose of its p-type doped GaN capping layer 108 is to define gate depletion regions of the FET devices rather than the winding portion of the resistor. Gates 118 will be formed on the p-type doped GaN capping layer 108. Gates 118 in the embodiment may be formed after sources/drains 112 through the same processes, for example by forming openings in the passivation layer 110 and depositing gate material, ex. Ni/Ag multilayer structure, in the openings and on the passivation layer 100. A photolithography process is then performed to form gate patterns and a rapid thermal annealing is performed to form ohmic contacts. It is shown in the figure that the formed gates 118 on the passivation layer 110 are also provided with horizontally extending field plate portions 118a, which may modify the electric field there to achieve better breakdown voltage. Other components and processes similar to the ones described in previous embodiment will not be herein repeated.

Figure 5:
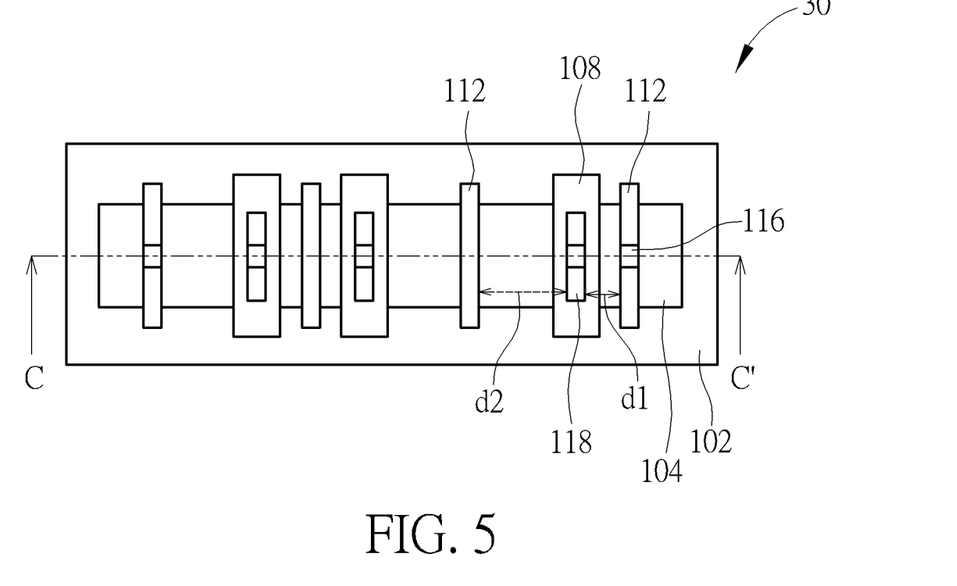
FIG. 5 is a schematic plan view of high-voltage HEMTs in accordance with the preferred embodiment of present invention.

Next, please refer to FIG. 5, which is a schematic plan view of high-voltage HEMTs in accordance with the preferred embodiment of present invention. In addition to the aforementioned resistor device and low-voltage logic device, in the embodiment of present invention, the GaN-base structure may also form desired HEMT structures on the substrate in similar way. As shown in the figure, similarly, the HEMTs 30 are also formed on the same GaN epitaxial layer 102 like aforementioned 2DEG resistors 10 and low-voltage logic FETs 20. The GaN epitaxial layer 102 is provided with the GaN mesa layer 104 and the AlGaN barrier layer 106 on the GaN mesa layer 104 to define the active areas of high-voltage HEMTs 30 and form 2DEG channels. In order to form normally-off gate depletion regions in the GaN mesa layer 104, multiple spaced apart p-type doped GaN capping layer 108 are provided on the AlGaN barrier layer 106, wherein each p-type doped GaN capping layer 108 corresponds to a gate region with a gate 118 formed thereon. Parts of the p-type doped GaN capping layer 108 may extend beyond the GaN mesa layer 104. In this way, the exposed GaN mesa layer/AlGaN barrier layer 104/106 would have higher conductivity than the ones of surrounding gate regions covered by the p-type doped GaN capping layer 108, so that they may function as source/drain regions of the high-voltage HEMTs 30, and sources/drains 112 are formed on those regions. Contacts 116 are further formed on gates 118 and sources/drains 112 to electrically connect to external circuits.

Please note that in the embodiment of present invention, the spacing d1 between source and gate of the high-voltage HEMT 30 is designedly not equal to the spacing d2 between drain and gate of the high-voltage HEMT 30. The drain-to-gate spacing d2 may be designedly several times larger than the source-to-gate spacing d1. The advantage of larger drain-to-gate spacing d2 is that the breakdown voltage of the device may be improved by extending drift regions and field plate portions. Relevant details will be described in following embodiments.

Please refer to FIG. 6, which is a cross-section along the section line C-C' in FIG. 5. The following embodiment will describe the vertical connections and relative positions of the components of the high-voltage HEMT 30 and their manufacturing method in cross-sectional views. The layer structures and processes of the high-voltage HEMT 30 are generally the same as the ones of aforementioned low-voltage logic FETs 20, with the difference that the high-voltage HEMT 30 is formed in the high-voltage device region 100c defined on the substrate 100 and is provided with larger drain-to-gate spacing d2 and additional field plate structures to improve breakdown voltage of the devices. Other components and processes similar to the ones described in previous embodiments will not be herein repeated.

After describing the layouts and structures of the 2DEG resistor 10, the low-voltage logic FET 20 and the high-voltage HEMT 30, basic RTL circuits constituted by the aforementioned 2DEG resistor 10 and low-voltage logic FET 20 of the present invention will now be described through FIG. 7 to FIG. 9.

Firstly, please refer to FIG. 7, which includes a schematic plan view and a circuit diagram of an inverter (INV) circuit structure in accordance with the preferred embodiment of present invention. As shown in the figure, the inverter INV of the present invention is constituted by a 2DEG resistor 10 and a low-voltage logic FET 20, wherein the gate of low-voltage logic FET 20 is connected to an input voltage In, the source of low-voltage logic FET 20 is grounded, and the drain of low-voltage logic FET 20 and the source of 2DEG resistor 10 are connected with each other and are connected collectively to an output voltage Out, while the drain of 2DEG resistor 10 is connected with an operating voltage VDD. In the operation, when the input voltage In equals the operating voltage VDD (high level), the low-voltage logic FET 20 is turned ON and the output voltage Out is approximately equal to the ground voltage GND (low level). When the input voltage In equals 0V (low level), the low-voltage logic FET 20 is in cut-off state and the output voltage Out is approximately equal to the operating voltage VDD (high level).

Figure 8:
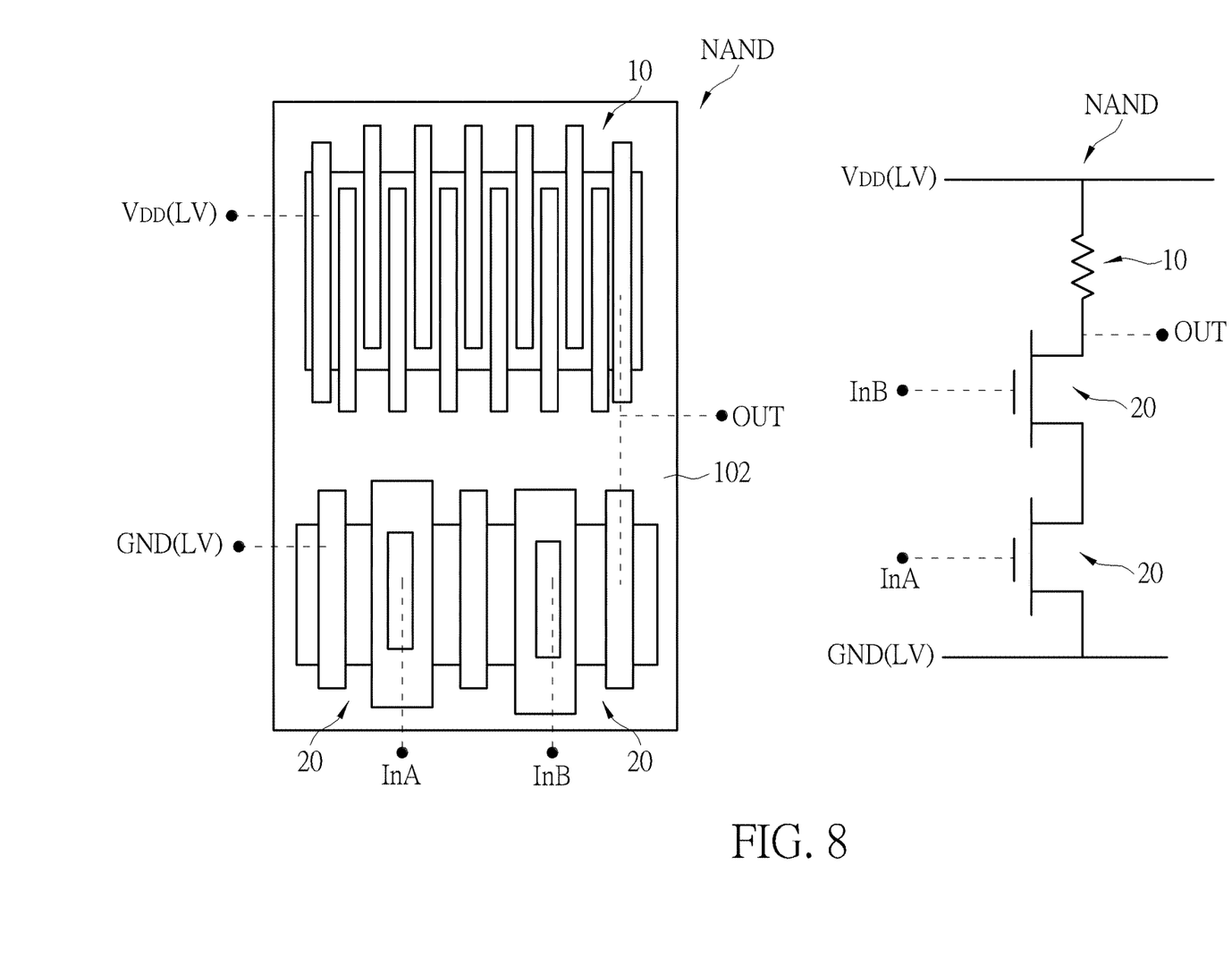
FIG. 8 is a schematic plan view and a circuit diagram of a resistor-transistor-logic NAND circuit structure in accordance with the preferred embodiment of present invention.
Figure 9:
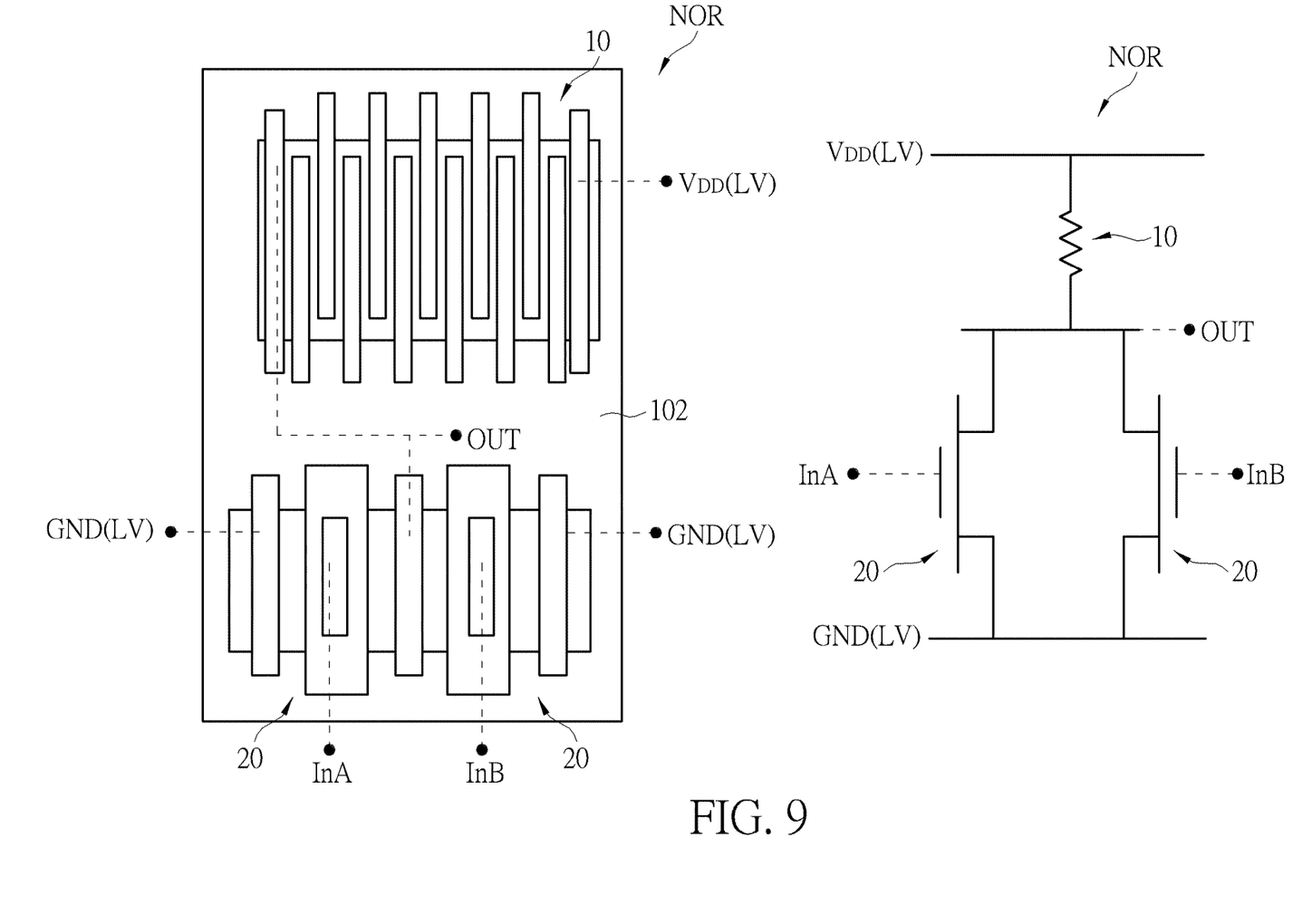
FIG. 9 is a schematic plan view and a circuit diagram of a resistor-transistor-logic NOR circuit structure in accordance with the preferred embodiment of present invention.

Next, please refer to FIG. 8, which includes a schematic plan view and a circuit diagram of a RTL NAND circuit structure in accordance with the preferred embodiment of present invention. As shown in the figure, the NAND circuit of the present invention is constituted by a 2DEG resistor 10 and two series low-voltage logic FETs 20, wherein the gates of the two low-voltage logic FETs 20 are connected respectively to an input voltage InA and an input voltage InB, the source of one of the low-voltage logic FET 20 is grounded, and the drain of the other low-voltage logic FET 20 and the source of 2DEG resistor 10 are connected with each other and are connected collectively to an output voltage Out, while the drain of 2DEG resistor 10 is connected with an operating voltage VDD. In the operation, only when the input voltages InA and InB both equal to the operating voltage $V_{DD}$ (high level), the two low-voltage logic FETs 20 in series will be turned ON to make the output voltage Out equals to the ground voltage GND (low level). When the two input voltages InA and InB are both in low level or one of them is in low level, at least one of the two series low-voltage logic FETs 20 would be in cut-off state to make the output voltage Out approximately equal the operating voltage VDD (high level).

Next, please refer to FIG. 9, which includes a schematic plan view and a circuit diagram of a RTL NOR circuit structure in accordance with the preferred embodiment of present invention. As shown in the figure, the NOR circuit of the present invention is constituted by a 2DEG resistor 10 and two parallel low-voltage logic FETs 20, wherein the gate of two low-voltage logic FETs 20 are connected respectively to an input voltage InA and an input voltage InB, two sources of the low-voltage logic FETs 20 are respectively grounded, the common drain of the two parallel low-voltage logic FETs 20 is connected with the source of 2DEG resistor 10 and are collectively connected to the output voltage Out, and the drain of 2DEG resistor 10 is connected with the operating voltage $V_{DD}$. In the operation, only when the input voltages InA and InB both equal 0V (low level), the output voltage Out of the common drain would be approximately equal to the operating voltage $V_{DD}$ (high level). When the two input voltages InA and InB are both in high level or one of them is in high level, at least one of the two low-voltage logic FETs 20 in parallel will be turn ON to make the output voltage Out of the common drain approximately equal to the ground voltage GND (low level).

After describing the application of 2DEG resistor 10 and low-voltage logic FET 20 of the present invention in RTL circuits, the following embodiment will describe the combination of 2DEG resistor 10 of the present invention with other known resistors to provide a full-scale resistor scheme with different resistance magnitudes to be applied in different circuit structures or components.

Figure 10:
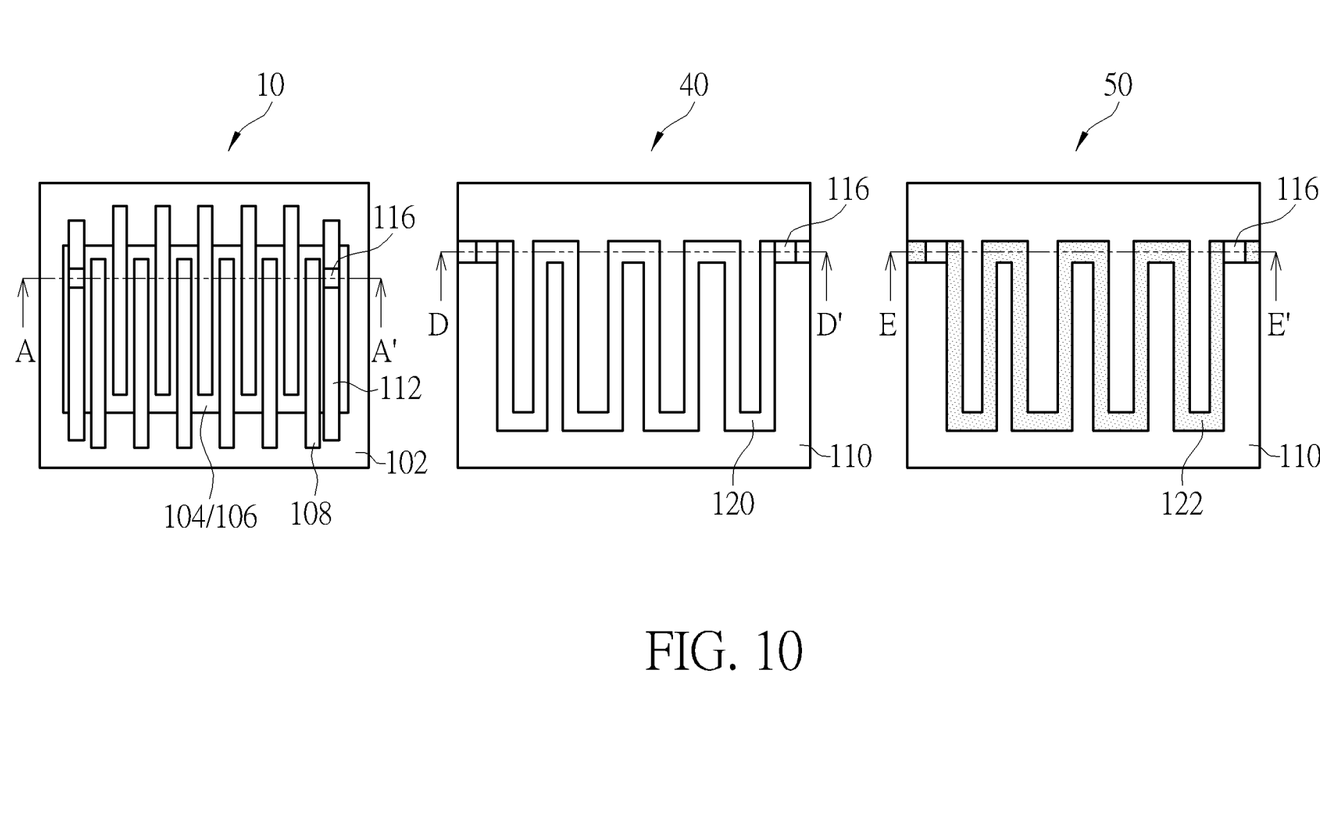
FIG. 10 is a schematic plan view of three different kinds of resistors, including a 2DEG resistor, an undoped polysilicon resistor and a doped polysilicon resistor in accordance with the preferred embodiment of present invention.

Firstly, please refer to FIG. 10, which is a schematic plan view of three different resistors, including a 2DEG resistor 10, an undoped polysilicon resistor 40 and a doped polysilicon resistor 50 in accordance with the preferred embodiment of present invention. The three different resistors are manufactured on the same GaN substrate with different materials for their winding portions, wherein the 2DEG resistor 10 uses GaN mesa layer 104, the undoped polysilicon resistor 40 uses undoped polysilicon layer 120 and the doped polysilicon resistor 50 uses doped polysilicon layer 122 as their winding portions. Since different materials are used, the three different resistors are provided with resistances in different magnitudes, wherein the resistance of undoped polysilicon resistor 40 is about 2000 ohm/sq (suitable for analog-to-digital converter, ADC), the resistances of 2DEG resistor 10 and doped polysilicon resistor 50 are respectively about 300 ohm/sq and 50 ohm/sq (suitable for RTL circuit).

Figure 11:
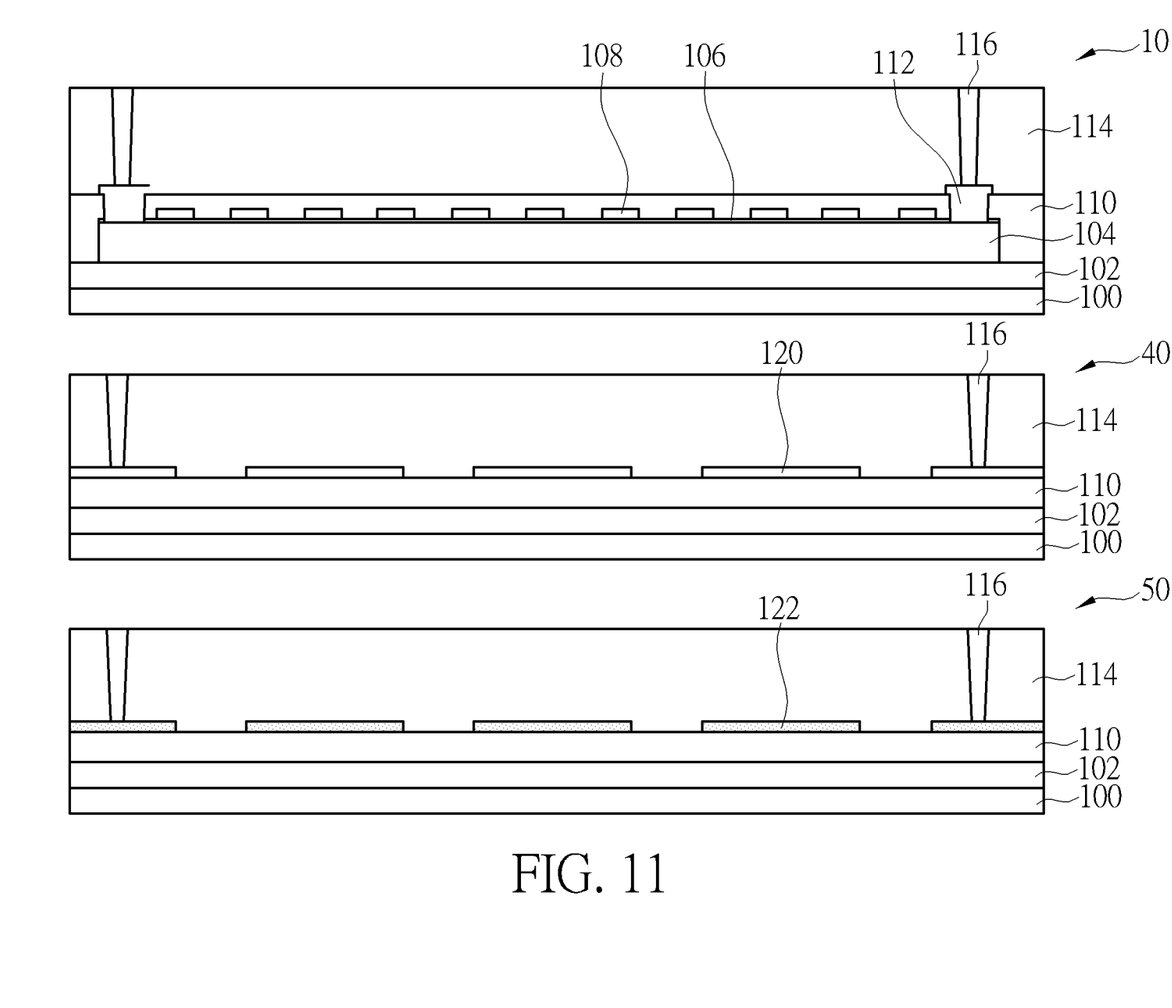
FIG. 11 is cross-sections along the section lines A-A', D-D' and E-E' in FIG. 10.

Next, please refer to FIG. 11, which includes cross-sections along the section lines A-A', D-D' and E-E' in FIG. 10. The following embodiment will describe the vertical connections and relative positions of the components of the three different resistors and their manufacturing method in cross-sectional views, wherein the details about the 2DEG resistor 10 is similar to previous embodiments and will not be herein repeated. Regarding the undoped polysilicon resistor 40, since 2DEG channel is not required in a non GaN-based resistor, layer structures like the GaN mesa layer 104, AlGaN barrier layer 106 and p-type doped GaN capping layer 108 are not formed on the GaN epitaxial layer 102 in the undoped polysilicon region. The doped polysilicon layer 120 is formed directly on the passivation layer 110 by a LPCVD process and function as the winding portion of the resistor, and the interlayer dielectric 114 covers on the whole resistor. Similarly, layer structures like the GaN mesa layer 104, AlGaN barrier layer 106 and p-type doped GaN capping layer 108 are not formed on the GaN epitaxial layer 102 of the doped polysilicon resistor 50. The doped polysilicon layer 122 may be formed directly on the passivation layer 110 by a CVD process, with in-situ doping using n-type dopants such as P or As, to function as the winding portion of the resistor.

It can be understood from the aforementioned embodiments that the resistor structures and relevant processes provided by the present invention may easily integrate the three different kinds of resistors, including 2DEG resistor 10, undoped polysilicon resistor 40 and doped polysilicon resistor 50, on the same GaN substrate without additional steps or modifying current process flow.

Figure 12:
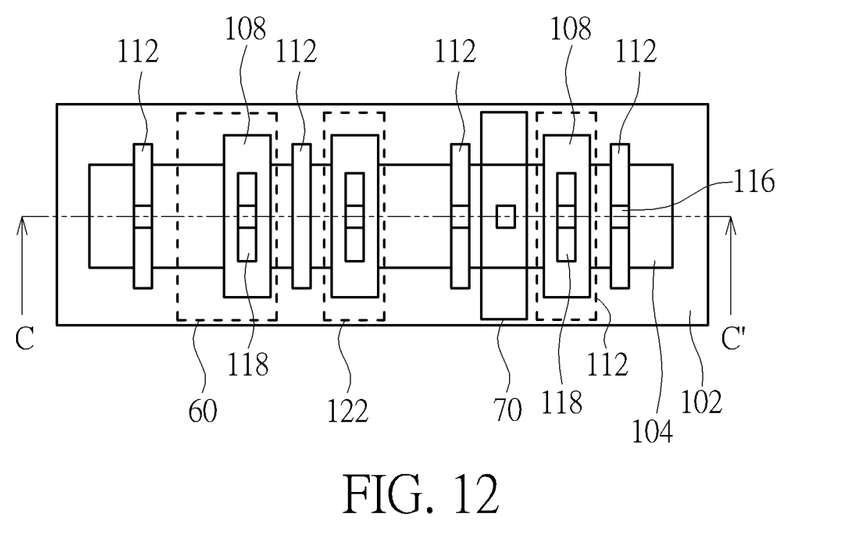
FIG. 12 is a schematic plan view of high-voltage HEMTs with field plate structures in accordance with another embodiment of present invention.
Figure 13:
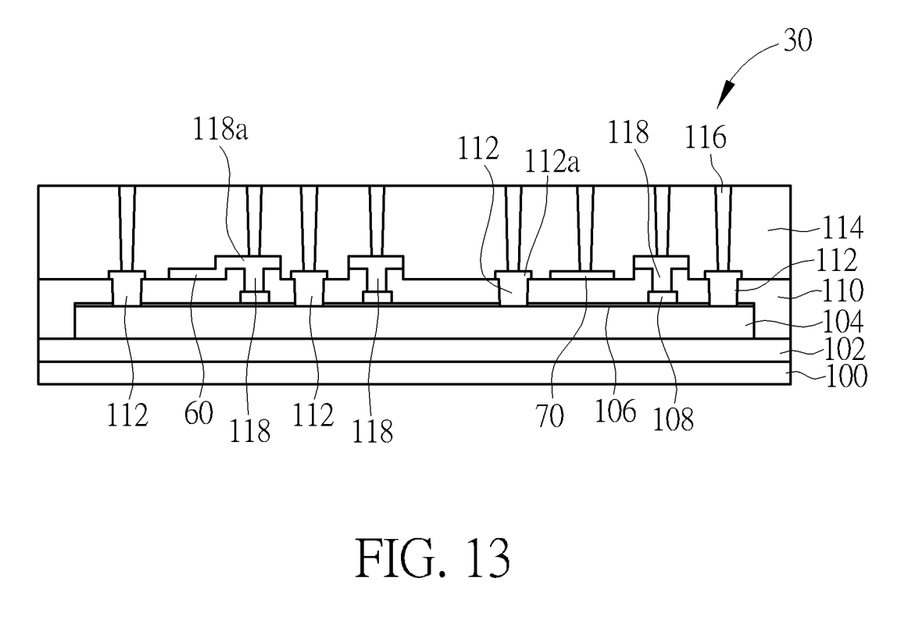
FIG. 13 is a cross-section along the section line C-C' in FIG. 12.

Next, please refer to FIG. 12 and FIG. 13, which include a schematic plan view of high-voltage HEMTs with field plate structures in accordance with another embodiment of present invention and a cross-section taken along the section line C-C' in FIG. 12. The high-voltage HEMT 30 in this embodiment is similar to the ones shown in FIG. 5 and FIG. 6, with differences that additional field plate structures 60, 70 are provided on the passivation layer 110 between gate 118 and drain 112 to further improve the breakdown voltage of the device, wherein the field plate structure 60 may be a part of original field plate portion 118a of the gate 118 or an individual pattern not connected with the gate 118 but formed simultaneously with the gate 118. Similarly, the field plate structure 60 may be a part of original field plate portion 112a of the drain 112 or an individual pattern not connected with the drain 112 but formed simultaneously with the gate 112. In the embodiment of present invention, the resistances of field plate structures 60 and 70 are approximately 0.2-0.3 ohm/sq, which may functions as a resistor structure to be applied in devices and circuits.

Figure 14:
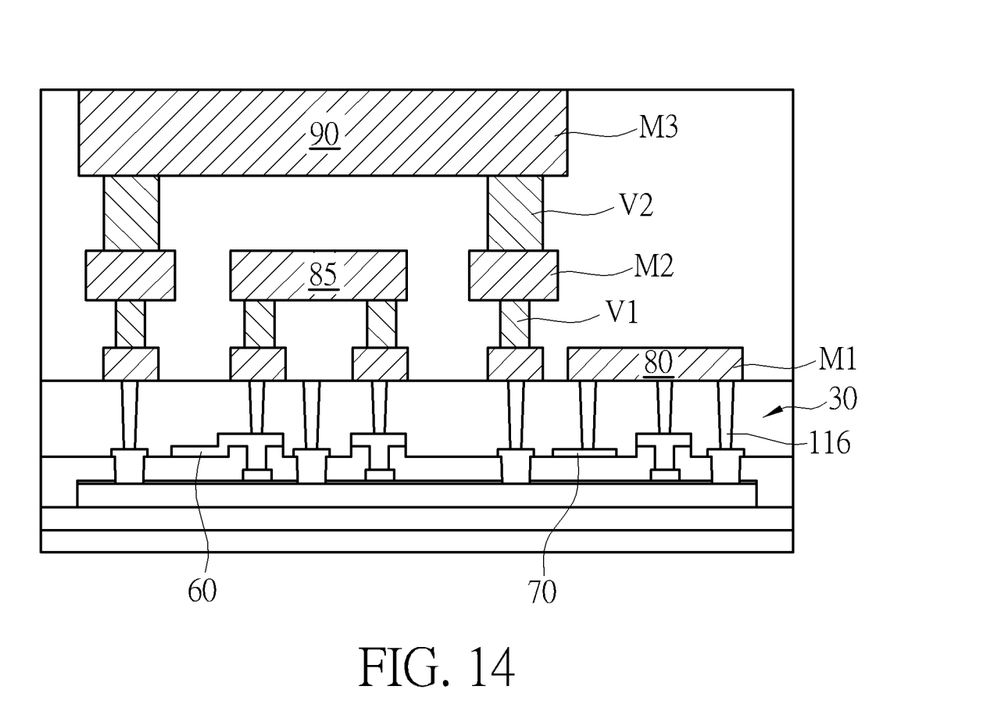
FIG. 14 is a cross-section of high-voltage HEMTs with upper metal interconnect resistors in accordance with another embodiment of present invention.

Lastly, please refer to FIG. 14, which is a cross-section of high-voltage HEMTs with upper metal interconnect resistors in accordance with another embodiment of present invention. In this embodiment of present invention, the resistors mentioned in previous embodiments may be further combined with the metal interconnect resistor formed in metal interconnect structure to achieve full-scale resistor scheme with different resistance magnitudes. As shown in the figure, the high-voltage HEMT 30 may be connected to the upper metal interconnects, such as metal layers M1, M2, M3 and vias V1, V2, through contacts 116. The desired metal interconnect resistor may be formed by parts of metal lines in the metal interconnect structure, such as the metal interconnect resistors 80, 85 and 90 respectively in metal layers M1, M2 and M3. As the thicknesses of upper metal layers are usually larger than the ones of lower metal layer, the resistances of metal interconnect resistors 80, 85, 90 become smaller in order. For example, the resistances of metal interconnect resistors 80, 85, 90 in the embodiment are respectively 0.08 ohm/sq, 0.04 ohm/sq and 0.01 ohm/sq.

Accordingly, as a summary to the aforementioned embodiments, a resistor combination and scheme integrated with the resistors with different resistance magnitudes, including 2DEG resistor 10, undoped polysilicon resistor 40, doped polysilicon resistor 50, field plate structures 60, 70 and the metal interconnect resistors 80, 85, 90, are provided in the present invention, with the resistances ranging from 5000 ohm/sq to 0.01 ohm/sq, to be applied in circuits required different resistance magnitudes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor with GaN structures, comprising:
   a GaN layer with a two-dimensional electron gas (2DEG) resistor region and an undoped polysilicon resistor region;
   an AlGaN barrier layer on said GaN layer in said 2DEG resistor region;
   multiple p-type doped GaN capping layers arranged in a staggered arrangement on said AlGaN barrier layer and not directly connected with any interconnects or not applied with voltages, so that said GaN layer not covered by said p-type doped GaN capping layers in said 2DEG resistor region forms a winding pattern and is converted into a 2DEG resistor;
   a passivation layer on said GaN layer; and
   an undoped polysilicon layer on said passivation layer in said undoped polysilicon resistor region and functioning as an undoped polysilicon resistor.

2. The resistor with GaN structures of claim 1, wherein said GaN layer comprises a lower GaN epitaxial layer and an upper GaN mesa layer, and said AlGaN barrier layer is on said GaN mesa layer.

3. The resistor with GaN structures of claim 1, wherein said undoped polysilicon layer forms a winding pattern on said passivation layer.

4. The resistor with GaN structures of claim 1, further comprising a first source and a first drain formed on said 2DEG resistor.

5. The resistor with GaN structures of claim 1, wherein said GaN layer further comprises a doped polysilicon resistor region, a doped polysilicon layer is formed on said passivation layer in said doped polysilicon resistor region, and said doped polysilicon layer functions as a doped polysilicon resistor.

6. The resistor with GaN structures of claim 5, wherein said doped polysilicon layer forms a winding pattern on said passivation layer.

* * * * *